(12) United States Patent
Lee

(10) Patent No.: US 8,415,826 B2
(45) Date of Patent: Apr. 9, 2013

(54) POWER OUTLET APPARATUS WITH MULTIPLE SOCKETS DETECTION, AND DETECTION METHOD THEREOF

(75) Inventor: Yu-Lung Lee, Miaoli County (TW)

(73) Assignee: Powertech Industrial Co., Ltd., Taipei Hsien (TW)

( * ) Notice: Subject to any disclaimer, the term of this patent is extended or adjusted under 35 U.S.C. 154(b) by 237 days.

(21) Appl. No.: 12/837,794

(22) Filed: Jul. 16, 2010

(65) Prior Publication Data
US 2011/0304205 A1    Dec. 15, 2011

(30) Foreign Application Priority Data
Jun. 9, 2010  (TW) .............................. 99118724 A

(51) Int. Cl.
*H02J 1/00*    (2006.01)
(52) U.S. Cl.
USPC ............................................ 307/11; 307/126
(58) Field of Classification Search ..................... 307/11, 307/126
See application file for complete search history.

(56) References Cited

U.S. PATENT DOCUMENTS

| | | | | |
|---|---|---|---|---|
| 5,107,685 A | * | 4/1992 | Kobayashi | 62/115 |
| 2004/0151190 A1 | * | 8/2004 | Kelliher et al. | 370/401 |
| 2007/0267919 A1 | * | 11/2007 | Borden et al. | 307/147 |

* cited by examiner

*Primary Examiner* — Daniel Cavallari
(74) *Attorney, Agent, or Firm* — Rosenberg, Klein & Lee

(57) ABSTRACT

A power outlet apparatus with multiple sockets detection, and the detection method and module thereof are disclosed. The apparatus includes a plurality of socket groups, a plurality of current detection unit, a voltage detection unit, a processing unit, and an output unit. In which the current detection units are installed at the socket groups respectively, for detecting a current data corresponding to each socket group. And the voltage detection unit is for measuring a voltage data of the socket groups. The voltage data and the current data are processed by a processing unit for obtaining an electricity information of each socket group.

12 Claims, 3 Drawing Sheets

POWER OUTLET APPARATUS WITH MULTIPLE SOCKETS DETECTION, AND DETECTION METHOD THEREOF

BACKGROUND OF THE INVENTION

1. Field of the Invention

The present invention relates to a power outlet apparatus; in particular, to a power outlet apparatus with multiple sockets detection, and detection method thereof.

2. Description of Related Art

With the advance in technology, electrical appliances required for daily life become more and more diversified. In general, the default sockets in the home environment or commercial environment are insufficient in number or too remote to allow power to reach the electrical appliance. Therefore, the power outlet apparatus emerged to allow the users to plug a greater number of devices, to extend the length of wiring, and to facilitate the users to manage the plugs and wirings.

In general, the traditional power outlet apparatus simply provides the increased number of sockets and extended length, but generally it is not equipped with the device to detect the status of electricity or the display thereof, while some users will need to know the total electricity consumption, thus came out with the power outlet apparatus having the display of total electricity consumption.

However, since it is normal that a plurality of electrical appliances are plugged to the power outlet apparatus, and the load, electricity consumption of each electrical appliance are different, a power outlet apparatus of the prior art, which is not equipped with the function of separate detection of the electricity consumption of each electrical appliance, will cause the user being unable to know the status of electricity consumption of each electrical appliance, thus fails to manage the electricity consumption of such electrical appliances efficiently.

SUMMARY OF THE INVENTION

The object of the present invention is to provide a power outlet apparatus by installing the current detection unit at each of outlet of the outlet apparatus to detect the current data of different sockets respectively and process such data to obtain the electricity information corresponding to each sockets for users to manage the use of electricity, so as to further enhance the practical value of the power outlet apparatus.

In order to achieve the aforementioned objects, according to an embodiment of the present invention, a power outlet apparatus with multiple sockets detection is provided, which comprises a plurality of sockets group, a plurality of current detection unit, a processing unit, a switching unit and an output unit.

The socket groups are used for receiving the input of electric power from the source of electricity, so as to supply electric energy to at least one electrical appliance to be plugged thereto. The current detection units are coupled to such socket groups respectively, which serve as the detection of respective current data corresponding to each socket group.

The processing units are coupled to a switching unit to receive the current data, and these current data are processed by the processing unit to obtain the respective electricity information of such socket group. The electricity information may include electric current, voltage, wattage, power frequency, power factor, kilowatt-hour (KW-h) and so on.

The switching unit is coupled between the current detection units and the processing unit to switch and transmitted those current data to the processing unit. The output unit is coupled to the processing unit to receive the electricity information transmitted from the processing unit and output/display such electricity information. The output unit may be a display unit or a communication unit, wherein the display unit is used to display such electricity information, and the communication unit is used to transmit the electricity information to an electronic device.

In addition, the power outlet apparatus may further include a voltage detection unit and a protection unit. The voltage detection unit is used to detect the voltage data inputted from the source of electricity and transmit such voltage data to the processing unit.

According to another embodiment of the present invention, a detection method of the power outlet apparatus is provided. Such power outlet apparatus receives the power supplied from the source of electricity and includes a plurality of socket groups to allow at least one electrical appliance to be plugged thereto. The detection method includes measuring the voltage data of the source of electricity and the respective current data of each socket groups, obtaining the respective electricity information of each socket group based on the voltage data and current data, transmitting the electricity information to an output unit for output/display. The so-called "output display" may include the display of such electricity information or transmission of such electricity information to an electronic device designated by the user and the like.

By respective installing the current detection unit at each socket group of the power outlet apparatus to detect the current data of each socket group, and transmitting such current data to the processing unit and being computed together with the voltage data, the electricity information of the respective socket group can be obtained, so as to facilitate the management and monitor of the power outlet apparatus, and further enhance the convenience and practical value of the power outlet apparatus.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1A:
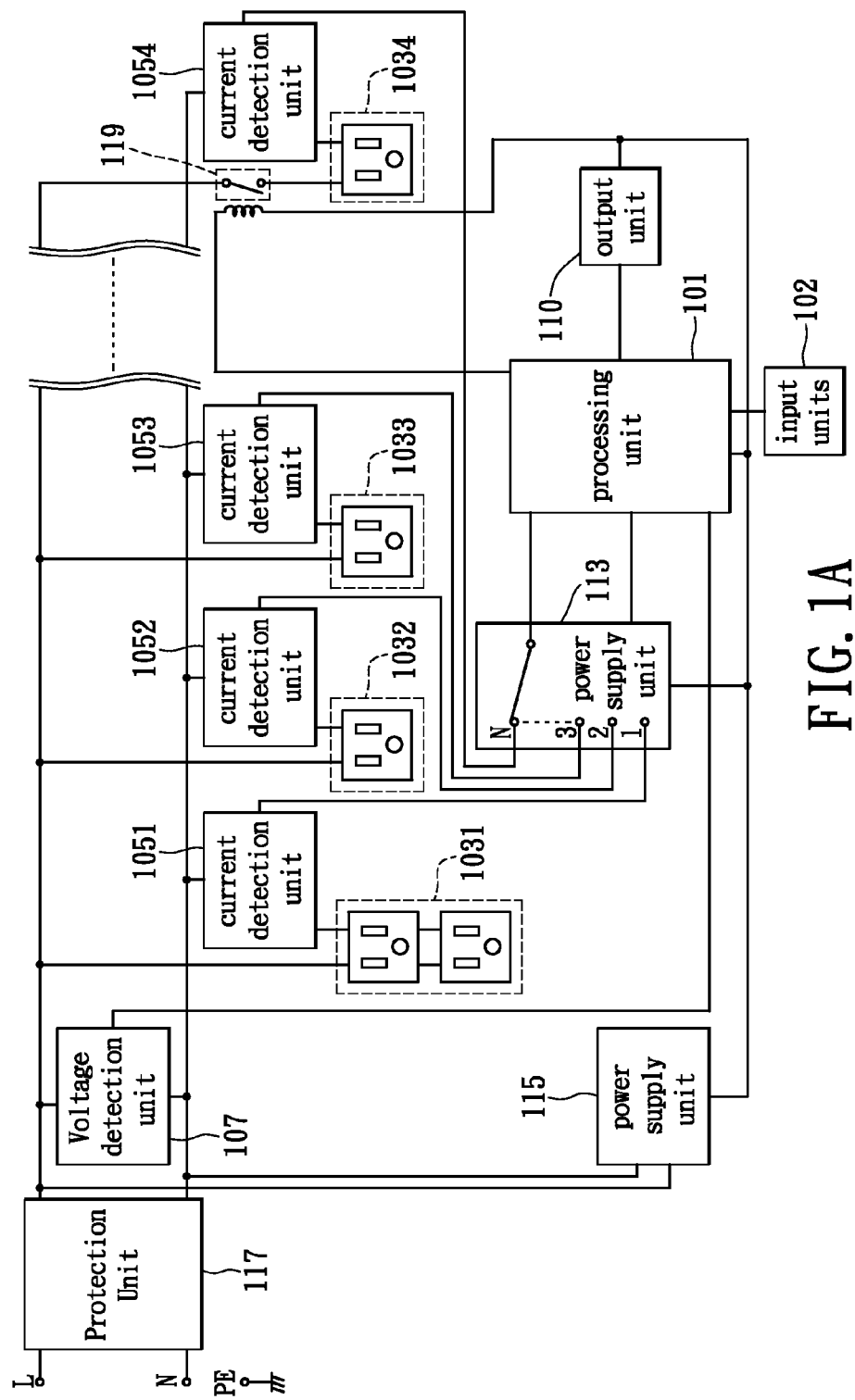
FIG. 1A shows a diagram of a power outlet apparatus with multiple sockets according to a first embodiment of the present invention.

Referring to FIG. 1A, a diagram of a power outlet apparatus with multiple sockets according to the first embodiment of the present invention, which comprises a processing unit 101, a plurality of socket groups 1031, 1032, 1033 and 1034, a plurality of current detection unit 1051, 1052, 1053 and 1054, a voltage detection unit 105, an output unit 110, and a power supply unit 115.

The sockets groups 1031,1032,1033 and 1034 may contain at least one socket, as shown in FIG. 1A, socket group 1031 contains two sockets, while the socket groups 1032,1033 and 1034 contain one socket respectively. The socket groups 1031, 1032, 1033 and 1034 are used for at least one electrical appliance which requires electrical power to be plugged thereto, so as to supply the required electrical power to such electrical appliances.

In this embodiment, the socket groups 1031,1032,1033, 1034 contains controllable sockets or uncontrollable sockets, as shown in FIG. 1A, socket group 1034 is a controllable socket, which contains a switch unit 119 that receives the control of switch-on or cut-off from the processing unit 101, so as to determine whether to supply the electrical power to the electrical appliance plugged to the socket group 1034. The switch-on or cut-off of the switch unit 119 will not affect the operation of the other socket groups 1031, 1032 and 1033.

The current detection units 1051, 1052, 1053 and 1054 that coupled to the socket groups 1031,1032, 1033 and 1034 respectively are used to detect the current data flowing through the socket groups 1031,1032,1033 and 1034. Such current data are then transmitted to the processing unit 103 through the switch unit 113. By respective installation of such current detection units 1051, 1052 and 1054, the current data of different socket groups can be detected respectively.

The voltage unit 107 is used to detect the voltage data of the input power. Since in this embodiment, each socket groups 1031, 1032, 1033 and 1034 are connected in parallel, the voltage data measured will represent the voltage of each of the socket groups 1031, 1032, 1033 and 1034. Such voltage data are also transmitted to the processing unit 101.

The processing unit 101 will receive the voltage data and current data of each socket group, and processing by computation so as to obtain the electricity information of the socket groups 1031, 1032, 1033 and 1034 respectively. The electricity information may include current, voltage, wattage, apparent power, reactive power, power frequency, power factor, and kilowatt-hour (KW-h) and so on. Afterwards, the electricity information will be transmitted to output unit 110 from the processing unit 101.

The output unit 110 may be a display unit, which is used to display the electricity information for user's check. Such display unit may be directly installed at the power outlet apparatus or a display device which is electrically connected and so on. Alternatively, the output unit 110 may also be a communication unit, which is used to transmit such electricity information to a electronic device designated by the user by wireless or wired means, so as to allow the users to further manage and monitor such electricity information.

Further, referring also to FIG. 1A, the power outlet apparatus may further contains a switch unit 113, a power supply unit 115, an input unit 102 and a protection unit 117. Among them, the switching unit 113 is coupled between the current detection units 1051,1052,1053,1054 and the processing unit 101, so as to switch the current data determined to transmit to the processing unit 101.

For example, the switching unit 113 may be automatically switched by a specific frequency so that the current data detected by the current detection units 1051,1052,1053, and 1054 can be continuously transmitted to the processing units 101 in real-time and thereby enable the processing unit 101 to compute the real-time electricity information. Alternatively, the switch unit 113 may also be controlled by the user, in this case the user may, by means of an input unit 102 which coupled to the processing unit 101, select the socket group to check the electricity information thereof, thereby enhance the convenience in use. The input unit 102 may allow the user to manipulate the input, such as to control the switch unit to transmit which current data detected by the current detection unit to the processing unit 101, the switching frequency of the switch unit 113 or the control of the output display of the electricity information of output unit 110 and so on. The input unit 102 may also be a communication unit through which the user may control such power output apparatus by a designated electronic device.

It is worth mentioned that, through the aforementioned switching unit 113, it is not necessary for the power outlet apparatus to install the processing unit 101 for each of socket groups 1031, 1032, 1033 and 1034. A single processing unit 101 can be used in common. Thus the dimensions and costs of the power outlet apparatus are saved.

Power supply unit 115 is used to convert the input power into the direct current (DC) and supply to each unit of the power outlet apparatus, such as the processing unit 101, the output unit 110 and so on. The protection unit 117 is installed at the location where the power inputted to the power outlet apparatus, which may be an electromagnetic interference (EMI) filtering unit or an surge protection unit and so on to protect each of the units of the power outlet apparatus against the damage caused by the unstable power supply, so as to enhance the safety of the power outlet apparatus.

Figure 1B:
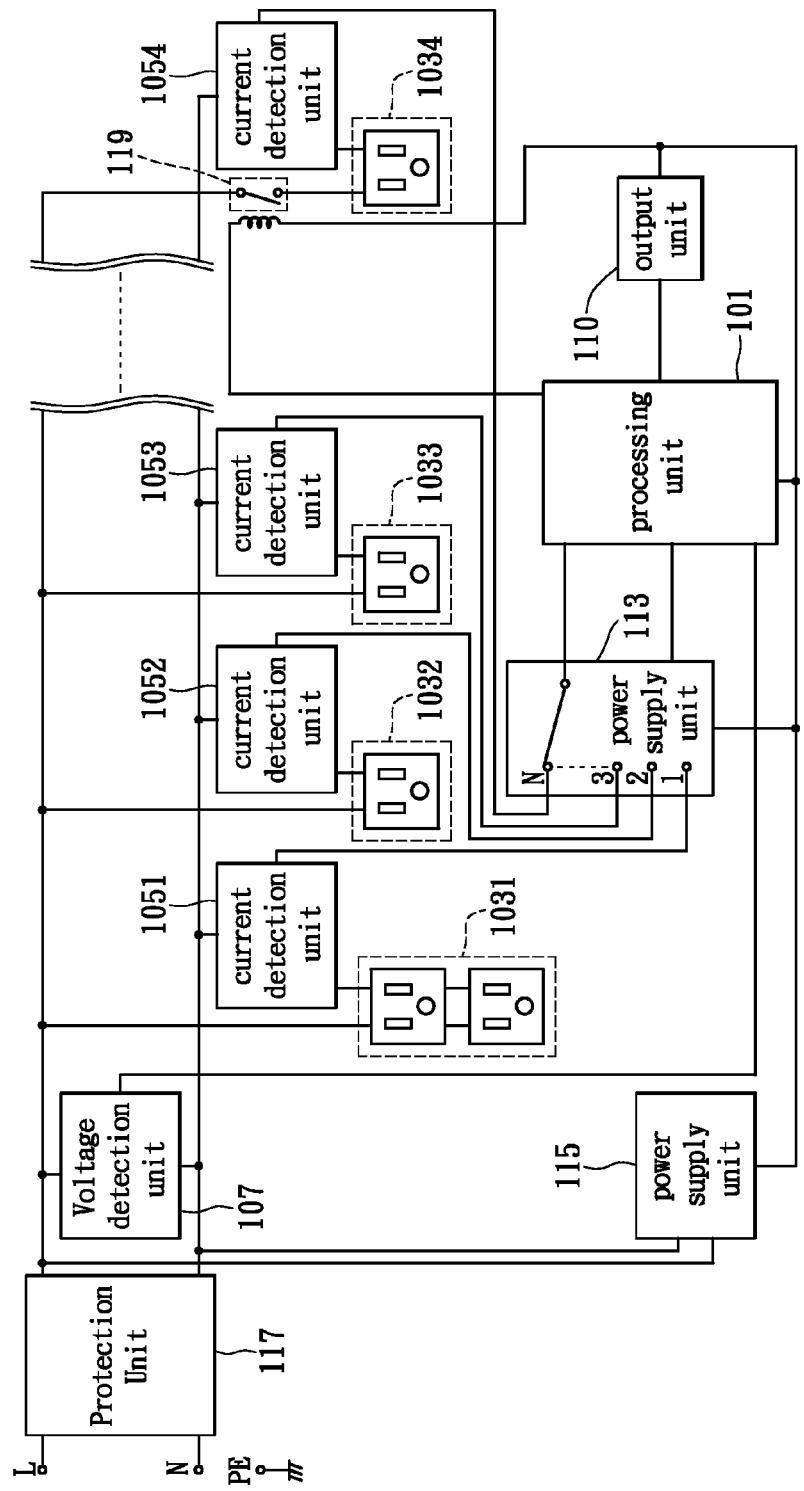
FIG. 1B shows a diagram of a power outlet apparatus with multiple sockets according to a second embodiment of the present invention.

Referring to FIG. 1B, a diagram of a power outlet apparatus with multiple sockets according to the second embodiment of the present invention. The difference between which and FIG. 1A is that the switching unit 113 of FIG. 1B may be a change-over switch or an equivalent circuit of a multiplexer to allow the user to manually control the switching frequency of the switch unit 113, or to arbitrarily select which of the current data to be transmitted to the processing unit 101.

Figure 2:
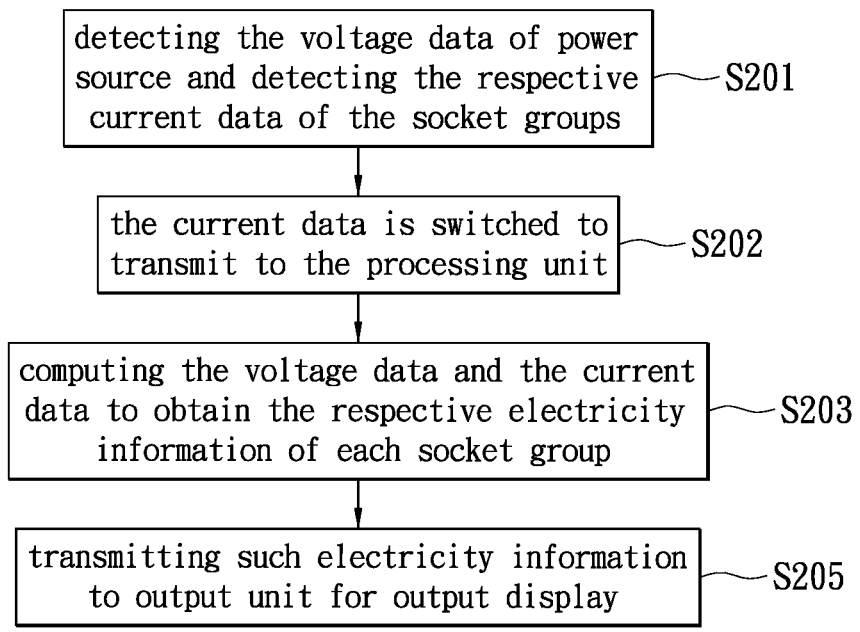
FIG. 2 shows a flow chart of a detection method according to an embodiment of the present invention.

Referring to FIG. 2, a flow chart illustrating the detection method for multiple sockets according to the embodiment of the present invention, which applies to the aforementioned power outlet apparatus and includes measuring the voltage data of power source and measuring the respective current data of each of the socket groups (S201), and computing the voltage data and the current data to obtain the respective electricity information of each socket group. (S205), and transmitting such electricity information to output unit for output display (S205). Wherein, such current data may be switched to transmit to the processing unit (S202). Further, the so-called "output display" may refer to displaying such electricity information for the user's check, or transmitting such electricity information to an electronic device designated by the user to facilitate the user's further management of such socket groups.

By separately installing the current detection units at each of the socket groups to detect the current data and coordinate the obtained voltage data, the electricity information of each socket group can be computed, so as to enhance the practical value of the power outlet apparatus.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A power outlet apparatus with multiple sockets detection, comprising:
    a plurality of socket groups for receiving electric energy of a power source, so as to supply the received electric energy to at least one electrical appliance plugged thereto;

a plurality of current detection units, coupled to the socket groups, for detecting a current data of each socket group;

a processing unit, electrically connected to the current detection units, for calculating the current data of each socket group to obtain corresponding electricity information of each socket group;

a switching unit, coupled between the current detection units and the processing unit, for selectively switching the current data of one of the socket groups to be transmitted to the processing unit, so as to allow the current data of each socket group to be processed by the processing unit, respectively; and an output unit, coupled to the processing unit, for transmitting the electricity information transmitted from the processing unit for output display;

wherein the current data of each socket group is switched to be transmitted by the switch unit, so as to allow the current data and a voltage data of the power source can be processed by the processing unit and thereby obtain the electricity information corresponding to each socket group.

2. The power outlet apparatus with multiple sockets detection according to claim 1, wherein the electricity information includes one of the current, voltage, wattage, apparent power, reactive power, power frequency, power factor, and kilowatt-hour (KW-h) or the combination thereof.

3. The power outlet apparatus with multiple sockets detection according to claim 1, wherein the output unit is a display unit which receives the electricity information for display.

4. The power outlet apparatus with multiple sockets detection according to claim 1, wherein the output unit is a communication unit which communicates with at least one electronic device, so as to transmit the electricity information to such electronic device.

5. The power outlet apparatus with multiple sockets detection according to claim 1, wherein the switch unit is a change-over switch or an equivalent circuit of a multiplexer, which is used to switch the current data to be transmitted.

6. The power outlet apparatus with multiple sockets detection according to claim 1, further comprising:

an input unit, which is coupled to the processing unit to allow the user to manipulate the input.

7. The power outlet apparatus with multiple sockets detection according to claim 1, further comprising:

a voltage detection unit, which is used to detect the voltage data inputted from the power source and transmit the voltage data to the processing unit.

8. A detection method of the power outlet apparatus, the power outlet apparatus receiving electric energy of a power source, and the power outlet apparatus having a plurality of socket groups for being plugged by at least one electrical appliance, comprising:

measuring a voltage data of the power source, and measuring a current data of each socket group;

switching and transmitting the current data to the processing unit;

computing and obtaining a electricity information of each socket group based on the voltage data and the current data; and transmitting the electricity information to an output unit for output display.

9. The detection method of the power outlet apparatus according to claim 8, wherein the output unit is a display unit which is used to display the electricity information corresponding to the socket groups.

10. The detection method of the power outlet apparatus according to claim 8, wherein the output unit is a communication unit which is used to transmit the electricity information to an electronic device designated by the user.

11. A power outlet apparatus with multiple sockets detection, comprising:

a controllable socket, connected in parallel to a power source, having a first detection unit to detect a first current data flowing through the controllable socket;

a uncontrollable socket, connected in parallel to the power source, having a second detection unit to detect a second current data flowing through the uncontrollable socket;

a detection unit, connected in parallel to the controllable socket and the uncontrollable socket for detecting a voltage data of the power source;

a processing unit for receiving the voltage data, the first current data, and the second current data, so as to obtain the electricity information corresponded to the controllable socket and the uncontrollable socket, respectively;

a switch unit for receiving the first current data and the second current data, and periodically transmitting the first current data or the second current data to the processing unit; and an output unit for receiving the electricity information transmitted from the processing unit, wherein the controllable socket comprises a power switch unit, and the processing unit controls the power switch unit to be turned on or turned off.

12. The power outlet apparatus with multiple sockets detection according to claim 11, further comprising a power supply unit for converting electric energy of the power source into direct current (DC), and supplying the converted electric energy to the processing unit, the output unit, and the switch unit; and a protection unit, installed between the power source and the controllable socket, being an electromagnetic interference (EMI) filtering unit or an surge protection unit.

* * * * *